US010297749B1

(12) United States Patent
Hashemi et al.

(10) Patent No.: US 10,297,749 B1

(45) Date of Patent: May 21, 2019

(54) HIGH DENSITY RESISTIVE RANDOM ACCESS MEMORY INTEGRATED ON COMPLEMENTARY METAL OXIDE SEMICONDUCTOR

(71) Applicant: INTERNATIONAL BUSINESS MACHINES CORPORATION, Armonk, NY (US)

(72) Inventors: Pouya Hashemi, White Plains, NY (US); Takashi Ando, Tuckahoe, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/838,963

(22) Filed: Dec. 12, 2017

(51) Int. Cl.

| | |
|---|---|
| ***G11C 11/00*** | (2006.01) |
| ***H01L 45/00*** | (2006.01) |
| ***G11C 13/00*** | (2006.01) |
| ***H01L 27/24*** | (2006.01) |

(52) U.S. Cl.

CPC ...... *H01L 45/1206* (2013.01); *G11C 13/0004* (2013.01); *G11C 13/0007* (2013.01); *H01L 27/2481* (2013.01); *H01L 45/147* (2013.01); *H01L 45/1616* (2013.01); *H01L 45/1641* (2013.01); *G11C 2213/71* (2013.01)

(58) Field of Classification Search

CPC ............... H01L 45/1206; H01L 45/147; H01L 45/1616; G11C 13/0004; G11C 13/0007

USPC ..................... 365/148, 185.05; 257/288, 2, 4

See application file for complete search history.

(56) References Cited

U.S. PATENT DOCUMENTS

| | | | | |
|---|---|---|---|---|
| 7,420,198 | B2 | 9/2008 | Baek et al. | |
| 8,154,003 | B2 | 4/2012 | Lee et al. | |
| 9,036,400 | B2 | 5/2015 | Lu | |
| 9,412,940 | B2 | 8/2016 | Sacchetto et al. | |
| 9,431,604 | B2 | 8/2016 | Liao et al. | |
| 9,461,649 | B2 | 10/2016 | Cong et al. | |
| 9,590,013 | B2 | 3/2017 | Jo et al. | |
| 9,741,765 | B1 | 8/2017 | Narayanan et al. | |
| 2007/0145431 | A1* | 6/2007 | Kim | H01L 29/42392 257/288 |
| 2015/0048296 | A1* | 2/2015 | Park | H01L 27/228 257/2 |

(Continued)

OTHER PUBLICATIONS

Baek, I.G. et al., "Realization of Vertical Resistive Memory (VRRAM) using cost effective 3D Process" 2011 IEEE International Electron Devices Meeting (IEDM) (Dec. 2011) pp. 31.8.1-31.8.4.

(Continued)

*Primary Examiner* — Connie C Yoha

(74) *Attorney, Agent, or Firm* — Tutunjian & Bitetto, P.C.; Vazken Alexanian

(57) ABSTRACT

A method for forming an electrical device including a resistive switching memory cell in combination with a transistor. In some embodiments, the method may include forming a semiconductor device including a source region and a drain region on opposing sides of a channel region. A dielectric layer may be formed over the semiconductor device. A drain via opening may be formed through the dielectric layer to expose an upper surface of the drain region of the semiconductor device. A resistive random access memory cell is formed in the drain via opening in direct contact with the drain region of the semiconductor device.

20 Claims, 9 Drawing Sheets

(56) References Cited

U.S. PATENT DOCUMENTS

2015/0090949 A1* 4/2015 Chang ................ H01L 45/1253 257/4
2015/0255718 A1* 9/2015 Liu ...................... H01L 45/122 257/4

OTHER PUBLICATIONS

Fang, Z. et al., "Fully CMOS-Compatible 1T1R Integration of Vertical Nanopillar GAA Transistor and Oxide-Based RRAM Cell for High-Density Nonvolatile Memory Application" IEEE Transactions on Electron Devices (Mar. 2013) pp. 1108-1113, vol. 60, No. 3.

* cited by examiner

HIGH DENSITY RESISTIVE RANDOM ACCESS MEMORY INTEGRATED ON COMPLEMENTARY METAL OXIDE SEMICONDUCTOR

BACKGROUND

Technical Field

The present invention relates generally to memory devices and semiconductor devices and, in particular, to a resistive switching memory stack integrated with field effect transistors.

Description of the Related Art

One example of non-volatile memory uses variable resistance memory elements that can be set to either low or high resistance states, and can remain in that state until subsequently reset to an initial condition. The variable resistance memory elements are individually connected between two orthogonally extending conductors (e.g., bit and word lines) where they cross each other in a two-dimensional array. The state of such a memory element is usually changed by proper voltages being placed on the intersecting conductors.

SUMMARY

According to an aspect of the present invention, a resistive switching memory stack is provided to provide a memory cell, e.g., resistive random access memory (ReRAM), that is integrated with a transistor by positioning the memory cell within the contact via to the drain region of the transistor. In one embodiment, an electrical device is provided that includes a planar orientated semiconductor device including a source region and a drain region on opposing sides of a channel region of a semiconductor material. The electrical device includes a resistive random access memory device positioned within a via contact to the drain region.

In another embodiment, an electrical device is provided that includes a semiconductor device including a source region and a drain region on opposing sides of a vertically orientated channel region of a semiconductor material. The electrical device includes a resistive random access memory device positioned within a via contact to the drain region.

According to another aspect of the present invention, a method is provided for forming an electrical device including a resistive switching memory cell in combination with a transistor. In some embodiments, the method may include forming a semiconductor device including a source region and a drain region on opposing sides of a channel region. A dielectric layer may be formed over the semiconductor device. A drain via opening may be formed through the dielectric layer to expose an upper surface of the drain region of the semiconductor device. A resistive random access memory cell is formed in the drain via opening in direct contact with the drain region of the semiconductor device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
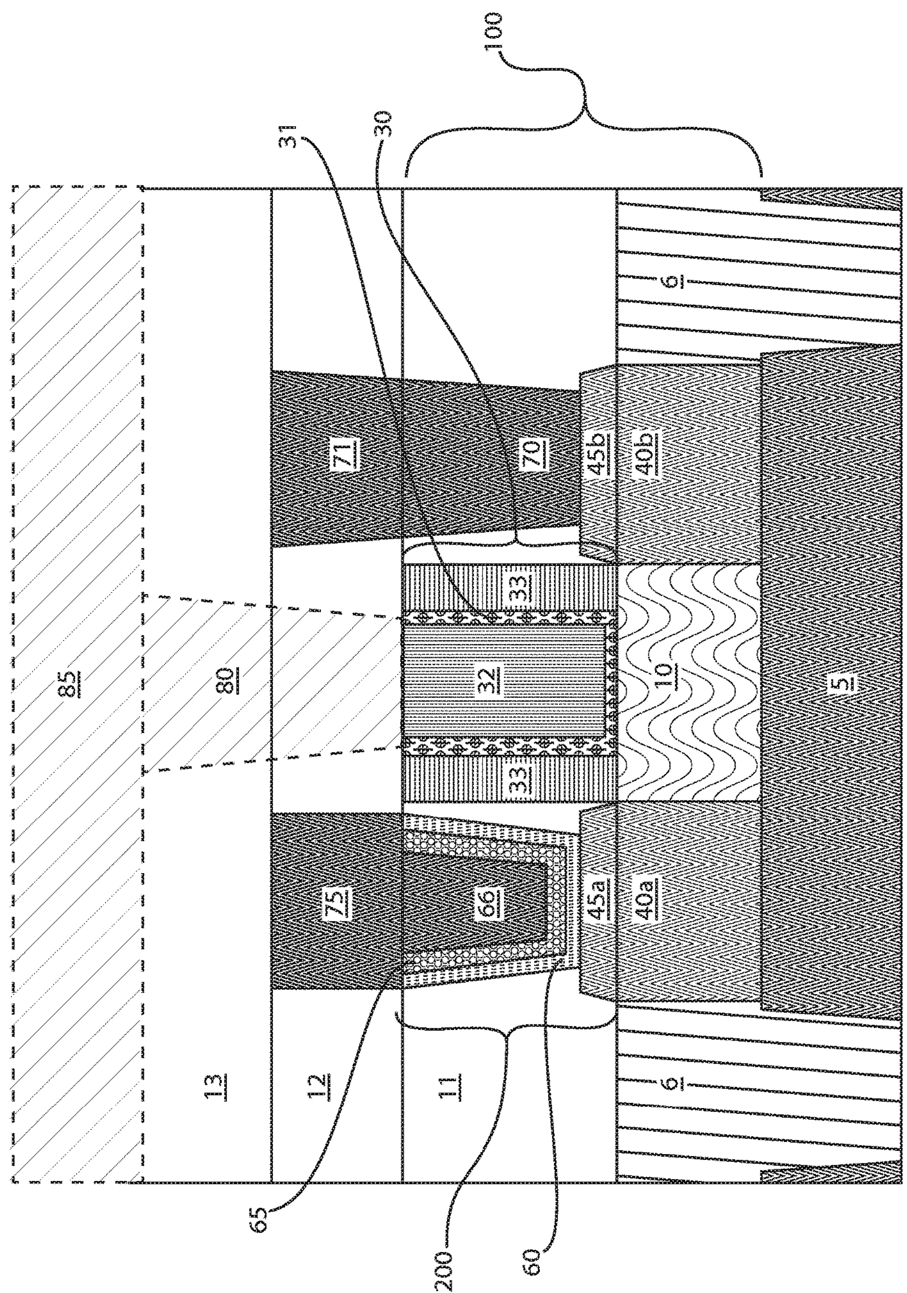
FIG. 1 is a side cross-sectional view of a fin type field effect transistor (FinFET) having a horizontal oriented channel region and a resistive random access memory cell that is in integrated with the FinFET by direct contact to the FinFETs drain region, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is directed to a resistive switching memory devices that are integrated with semiconductor devices, e.g., in complementary metal oxide semiconductor (CMOS) devices. As used herein, the term "memory device" means a structure in which the electrical state can be altered and then retained in the altered state, in this way a bit of information can be stored. The memory devices may be integrated with semiconductor devices, such as field effect transistors (FETs). As used herein, a "field effect transistor" is a transistor in which output current, i.e., source-drain current, is controlled by the voltage applied to the gate structure. A field effect transistor has three terminals, i.e., gate structure, source region and drain region. A "gate structure" means a structure used to control output current (i.e., flow of carriers in the channel) of a semiconducting device through electrical or magnetic fields. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel.

Resistive random access memory (ReRAM) devices can be suitable for applications, such as a non-volatile memory, and for use in low voltage, high endurance and high density applications. ReRAM is also suitable for cross-bar arrays in neuromorphic applications. For Oxide ReRAM, electro-forming of current conducting filament can be needed. In some embodiments, this process relies on randomness, and is not necessarily under control, which can be a roadblock for ReRAM cell area scaling.

Oxide ReRAM devices may include a current control field effect transistor (FET) to form a one transistor one resistive random access memory cell (1T1R) structure. This arrange typically comes with penalty in device footprint.

In some embodiments, the methods and structures described herein provide a one transistor or resistive random access memory (ReRAM)(1T1R) device, in which the memory cell, i.e., resistive random access memory (ReRAM) cell, is integrated into a contact via to a drain region of the field effect transistor (FET), thus no additional footprint is required. In one embodiment, the resistive random access memory (ReRAM) cell includes a lower electrode, a switching metal oxide layer and an upper electrode, in which at least the switching metal oxide layer and the upper electrode are positioned in the via to the drain region of the semiconductor device. In some embodiments, the contact via to the source region of the field effect transistor (FET) is a regular via, i.e., contact via.

FIG. 1 depicts one embodiment of a fin type field effect transistor (FinFET) 100 having a horizontal oriented channel region and a resistive random access memory cell 200 that is in integrated with the FinFET by direct contact to the FinFETs drain region. A FinFET semiconductor device is a semiconductor device in which the channel region is present within a fin structure. As used herein, a "fin structure" refers to a semiconductor material, which is employed as the body of a semiconductor diode, in which the gate structure is positioned around the fin structure such that charge flows down the fin structure. Fin structures 10 have a greater height than width. For example, the fin structure 10 can have a height ranging from 5 nm to 200 nm. In one embodiment, the fin structure 20 can have a width of less than 15 nm.

The fin structure 10 can be composed of a type IV semiconductor. Examples of type IV semiconductor that are suitable for the fin structure 10 include silicon (Si), crystalline silicon (c-Si), monocrystalline silicon, germanium, silicon germanium (SiGe), silicon doped with carbon (Si:C), silicon germanium doped with carbon (SiGe:C) and a combination thereof, and similar semiconductors, e.g., semiconductor materials including at least one element from Group IVA (i.e., Group 14) of the Periodic Table of Elements. In other examples, the fin structure 10 may be composed of a type III-V semiconductor. Gallium arsenic (GaAs) is one example of a type III-V semiconductor.

The fin structure 10 is present overlying a supporting substrate 5. The supporting substrate 5 may be a dielectric material, such as silicon oxide, silicon nitride and/or glass; and or the supporting substrate 5 may be a semiconductor material, such as a type IV semiconductor, e.g., silicon, and/or a type III-V semiconductor, e.g., gallium arsenic.

A gate structure 30 may be present on the channel region of the fin structure 10. The gate structure 30 includes a gate dielectric 31 and a gate electrode 32. A gate sidewall spacer 33 is present on sidewalls of the gate structure 30.

Source and drain regions 40*a*, 40*b* may be present on opposing sides of the channel region of the fin structure 10. The source and drain regions 40*a*, 40*b* include an epitaxial semiconductor material portion. The epitaxial semiconductor material portion 45*a*, 45*b* is doped to a p-type or n-type dopant, and may have a higher doping concentration than the source and drain region portions of the fin structure 10. The epitaxial semiconductor material portion 45*a*, 45*b* may be referred to a highly doped source and drain region portion, whereas the portion fin structure that the epitaxial semiconductor material portion 45*a*, 45*b* is formed on can have a lesser concentration and can be referred to a source and drain extensions regions.

In some example, the epitaxial semiconductor material 45*a*, 45*b* may also provide the lower electrode (also referred to as bottom electrode) of the resistive random access memory cell 200. The resistive random access memory cell 200 may include a lower electrode provided by the epitaxial semiconductor material 45*a* that provides a portion of the drain region of the semiconductor device 100, a switching dielectric layer 60, and an upper electrode 65, in which at least the switching dielectric layer 60 and the upper electrode 65 are present within an via contact opening through a first dielectric layer 11 to the drain region 40*a* of the semiconductor device 100.

The first dielectric layer 11 encapsulates the semiconductor device 100, and may have an upper surface that is coplanar with the upper surface of the gate structure 30. The dielectric layer 11 has contact openings, i.e., vias, to both the source region 40*b* and the drain region 40*a* of the semiconductor device 100. More specifically, at the base of the contact opening for the drain region 40_a_ is the doped epitaxial semiconductor material 45_a_ that provides the lower electrode for the resistive random access memory cell 200. The doped epitaxial semiconductor material 45_a_ may be n-type doped silicon. The switching dielectric layer 60 may be a metal oxide. The metal oxide layer that provides the switching dielectric layer 60 may be present on the portion of the doped epitaxial semiconductor material 45 exposed at the base of the contact opening to the drain region 40_a_, and may be present on the sidewalls of the contact opening. The switching dielectric 60 may have a conformal thickness. The term "conformal" denotes a layer having a thickness that does not deviate from greater than or less than 30% of an average value for the thickness of the layer. The metal oxide that provides the switching dielectric layer 60 may be one of hafnium oxide ($HfO_x$), tantalum oxide ($TaO_x$), titanium oxide ($TiO_x$), aluminum oxide (AlOx), and combinations thereof.

The upper electrode 65 of the resistive random access memory device is also present within the contact via to the drain region 40_a_ of the semiconductor device 100. The upper electrode 65 may be a material layer that has a conformal thickness and is present in direct contact with the switching layer at the base and the sidewalls of the contact via. The upper electrode 65 may be composed of one or more metal nitride material layers. For example, the upper electrode 65 may be composed of a metal nitride, such as titanium nitride (TiN), tantalum nitride (TaN), tungsten nitride (WN) or combinations thereof. In other embodiments, the upper electrode may be a multilayered structure including metal nitride layer and aluminum containing layers. In one example, the upper electrode 65 includes a first titanium nitride layer that is present in direct contact with the switching dielectric layer 60; an aluminum containing alloy layer, e.g., titanium aluminum carbide (TiAlC), that is in direct contact with the first titanium nitride layer; and a second titanium nitride layer that is in direct contact with the aluminum containing alloy layer.

It is noted that in some embodiments, the upper electrode 65 is not necessarily required to be a conformal layer. In some embodiments, the upper electrode 65 may fill a remainder of the contact opening to the drain region 40_a_.

In some embodiments, a barrier layer (not shown) may be present atop the upper electrode 65, and a metal fill 66 of a low resistivity metal, such as tungsten (W), cobalt (Co), or copper (Cu) may fill a reminder of the contact opening. The barrier layer may be composed of a metal nitride, such as tantalum nitride (TaN). Tungsten (W), cobalt (Co), and copper (Cu) are not the only materials that maybe employed for the metal fill 66. The metal fill 66 may also be composed of aluminum (Al), silver (Ag), gold (Au), titanium (Ti), platinum (Pt) and combinations thereof.

The material that provides the metal fill 66 within the contact via to the drain region 40_a_, may have the same composition as the metal fill 70 that is in the contact via to the source region 40_b_ of the semiconductor device 100. The contact via to the source region 40_b_ does not include a resistive random access memory cell. The metal fill 70 that is present in the contact via to the source region 40_b_ may be referred to as a source contact 70.

Still referring to FIG. 1, a second dielectric layer 12 is present atop the first dielectric layer 11. The second dielectric layer 12 may include therein a bit line 75 that is in direct contact with the resistive random access memory cell 200, and a source line 71 that is in electrical communication with the source contact 70. The bit line 75 and the source line 71 may be composed of an electrically conductive material similar to the metal fill 70 described above, e.g., copper and/or tungsten.

Sill referring top FIG. 1, a third dielectric layer 13 is present atop the second dielectric layer 12. A gate contact 80 may extend through the third dielectric layer 13 and the second dielectric layer 12 in communication with the gate structure 30. A word line 85 is present in electrical communication with the gate contact 80. The word line 85 and the gate contact 80 may be composed of an electrically conductive material similar to the metal fill 70 described above, e.g., copper and/or tungsten.

It is noted that the gate contact 80 is offset from the drain contact, i.e., the resistive random access memory (ReRAM) cell 200, and the source contact 70.

Figure 2:
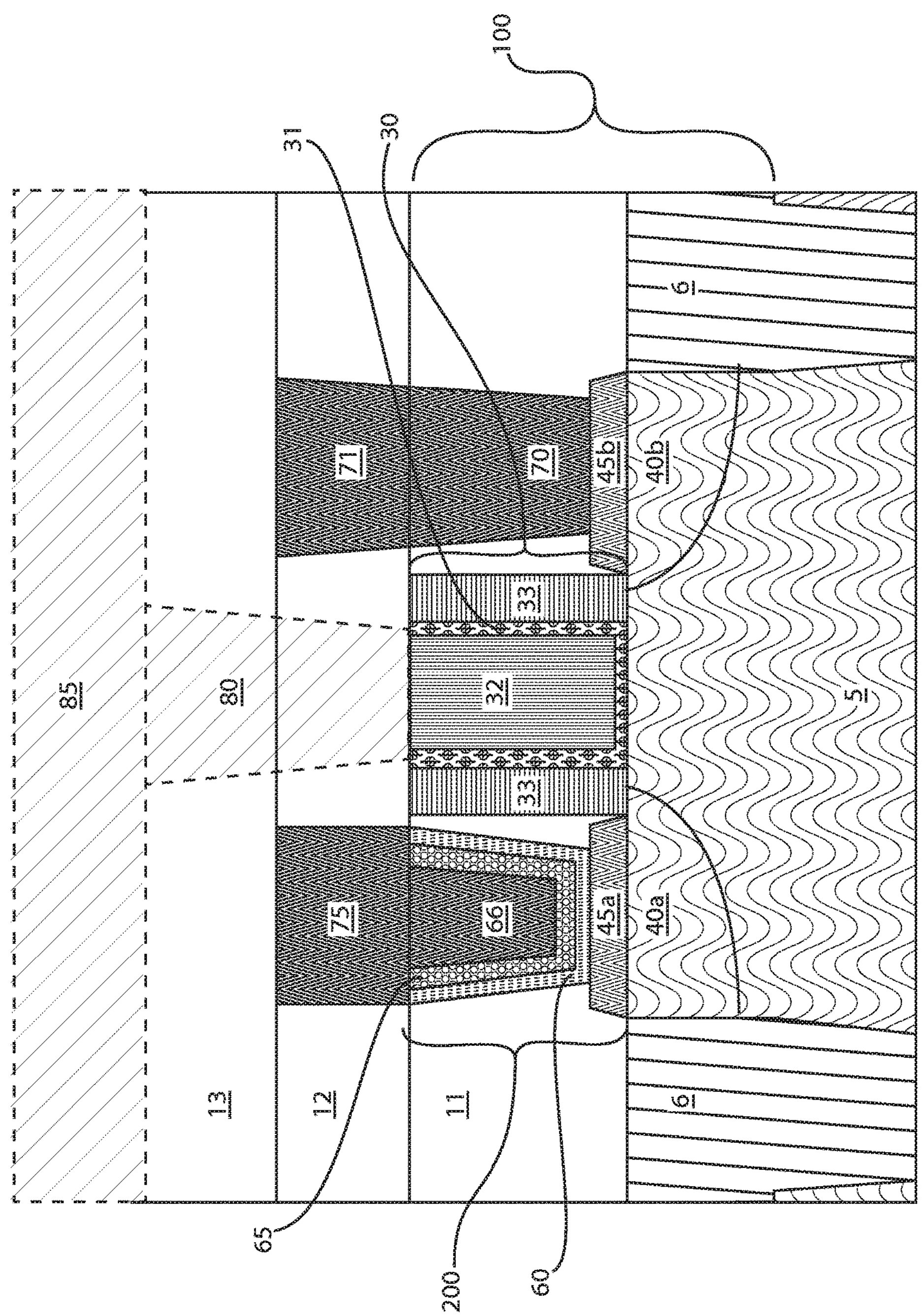
FIG. 2 is a side cross-sectional view of a metal oxide semiconductor field effect transistor that is a planar type semiconductor device, in which the channel of the device is present within the upper surface of the semiconductor material of a substrate, and a resistive random access memory cell is integrated with the MOSFET by direct contact to the MOSFET drain region, in accordance with one embodiment of the present disclosure.

It is noted that the semiconductor device 100 is not limited to being a FinFET device 100 as depicted in FIG. 1. In some embodiments, the semiconductor device 100 may be a MOSFET semiconductor device, i.e., planar semiconductor device, as depicted in FIG. 2. In the MOSFET semiconductor device, the channel region is present in the upper semiconductor surface of the substrate 5, as opposed to being present in a fin structure 10 that is overlying a substrate 5 in the FinFET device depicted in FIG. 1. The source and drain regions 40_a_, 40_b_ are present as implanted regions in the substrate in the MOSFET semiconductor device depicted in FIG. 2. The epitaxial semiconductor material 45_a_ that provides the lower electrode of the resistive random access memory device (ReRAM) 200 is a raised drain region that is composed of an epitaxial semiconductor material having a higher concentration of the same conductivity type dopant as the underlying drain region 40_a_. Similar epitaxial semiconductor material 45_b_ is formed on the upper surface of the source region 40_a_. With the exception of the aforementioned described differences, the remainder of the structures having reference numbers in FIG. 2 are similar to the structures having the same reference number in FIG. 1. Therefore, the description of the structures having reference numbers in FIG. 1 are suitable for describing the structures having the same reference numbers in FIG. 2. This of course is with exception to the different semiconductor devices 100 that are depicted in FIGS. 1 and 2. For example, the resistive random access memory cell 200 that is depicted in FIG. 2 includes a lower electrode provided by the raised drain region, i.e., doped epitaxial semiconductor material 45_a_, that is present atop the drain region 40_a_; a switching dielectric layer 60, e.g., metal oxide layer, that is present atop the lower electrode; and an upper electrode 65 that is present atop the switching dielectric layer 60.

Figure 3:
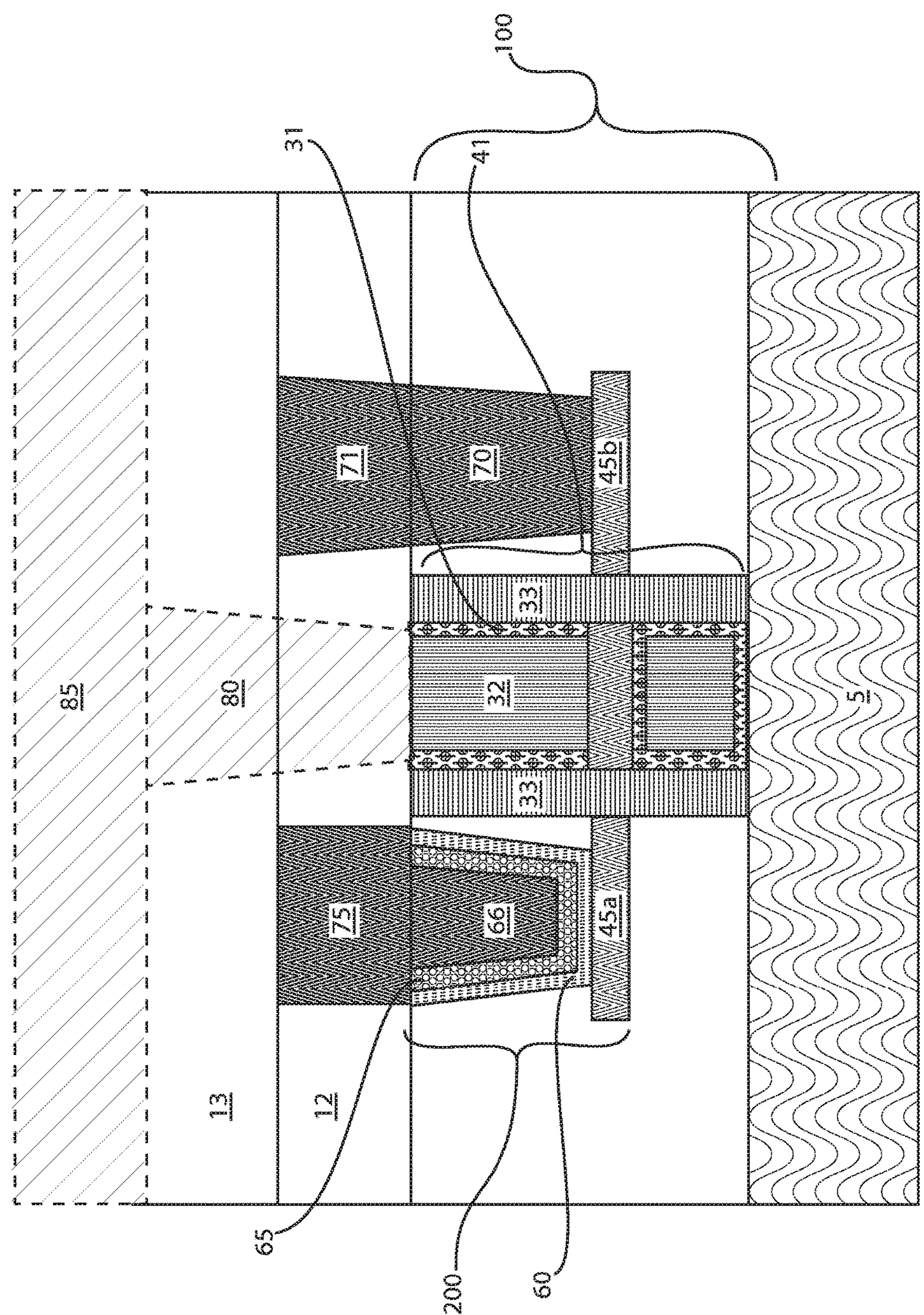
FIG. 3 is a side cross-sectional view of a semiconductor device in which the channel is suspended in a nanowire and/or nanosheet, and a resistive random access memory cell is integrated with the semiconductor device by direct contact to the drain regions of the semiconductor device, in accordance with one embodiment of the present disclosure.

It is noted that the semiconductor device 100 is not limited to being a FinFET device 100 as depicted in FIG. 1. In some embodiments, the semiconductor device 100 may be a semiconductor device having a channel region that is present within a nanowire and/or nanosheet. FIG. 3 depicts one embodiment of a semiconductor device 100 in which the channel is suspended in a nanowire and/or nanosheet (collectively identified by reference number 11), and a resistive random access memory cell is integrated with the semiconductor device 100 by direct contact to the drain regions 40_a_ of the semiconductor device 100.

The nanowire and/or nanosheet 11 that includes the channel region is supported by the spacer 33 to be positioned above the substrate 5. The term "nanosheet" denotes a substantially two dimensional structure with thickness in a scale ranging from 1 to 100 nm. The width and length dimensions of the nanosheet may be greater than the width dimensions. A nanowire generally has an arcular, e.g., circular and/or oblong, cross-section. Referring to FIG. 3, the gate structure 41 may be a gate all around structure (GAA). Gate structure materials, electrically conductive materials and/or semiconductor materials may be formed in the space surrounding the suspended structures, and are referred to as gate all around (GAA) gate structures 41. The source and drain region portions 45*a*, 45*b* of the nanosheets/nanowires 11 may be composed of doped epitaxial semiconductor material that is present extending beyond the spacer 33. The epitaxial semiconductor material 45*a* of the drain region of the nanosheet/nanowires 11 provides the lower electrode of the resistive random access memory device (ReRAM) 200.

With the exception of the aforementioned described differences, the remainder of the structures having reference numbers in FIG. 3 are similar to the structures having the same reference number in FIG. 1. Therefore, the description of the structures having reference numbers in FIG. 1 are suitable for describing the structures having the same reference numbers in FIG. 3. This of course is with exception to the different semiconductor devices 100 that are depicted in FIGS. 1 and 3. For example, the resistive random access memory cell 200 that is depicted in FIG. 3 also includes a switching dielectric layer 60, e.g., metal oxide layer, that is present atop the lower electrode; and an upper electrode 65 that is present atop the switching dielectric layer 60.

Figure 4:
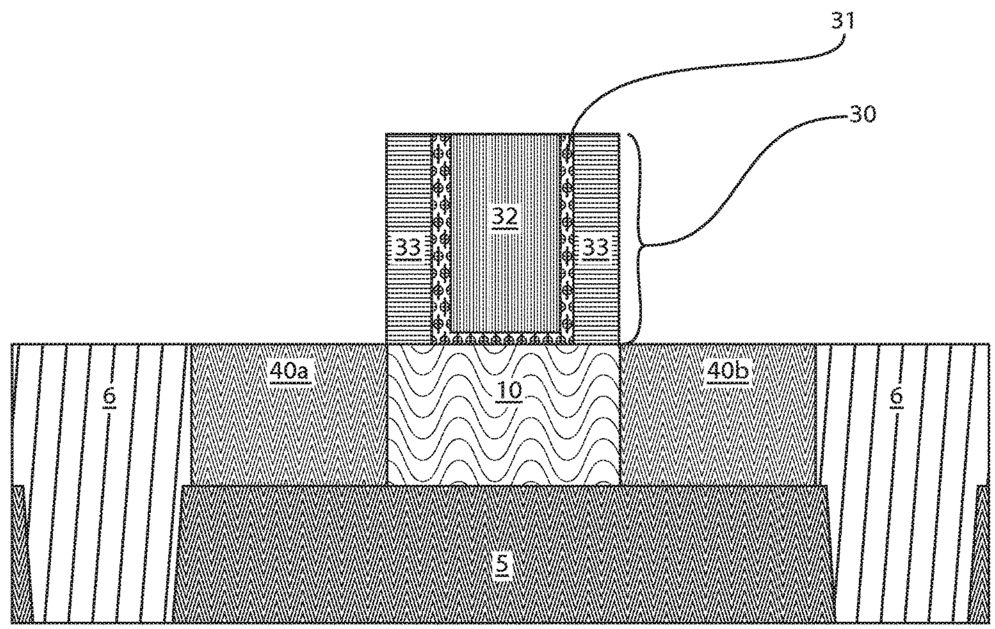
FIG. 4 is a side cross-sectional view of a semiconductor device as an initial structure to forming the electrical device that includes the resistive random access memory cell that is in direct contact with the drain region of the semiconductor device, as depicted in FIG. 1.
Figure 5:
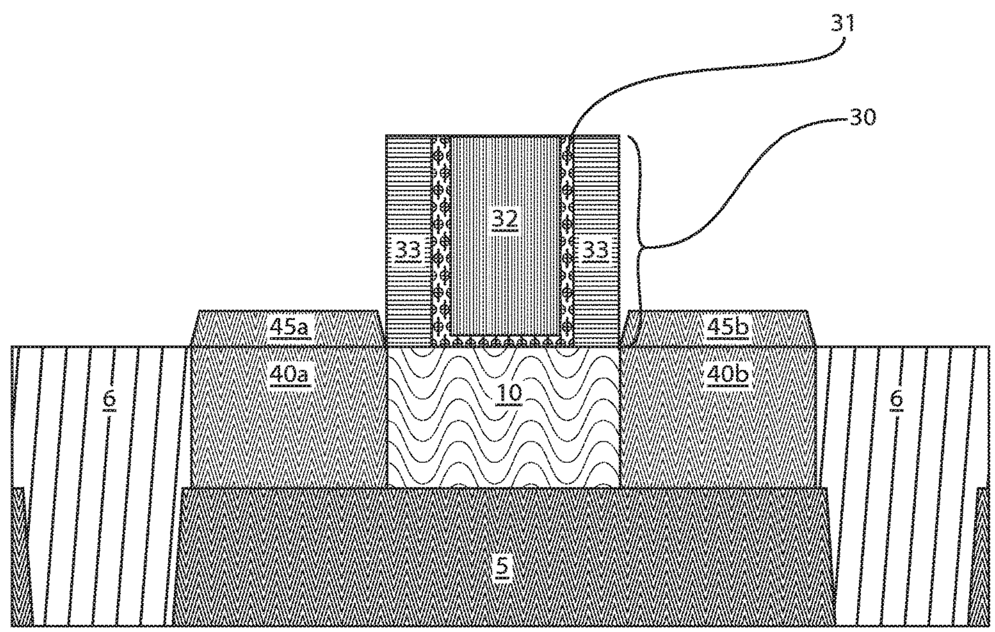
FIG. 5 is a side cross-sectional view of epitaxially forming a lower electrode on the drain region of the semiconductor device, in accordance with one embodiment of the present disclosure.
Figure 6:
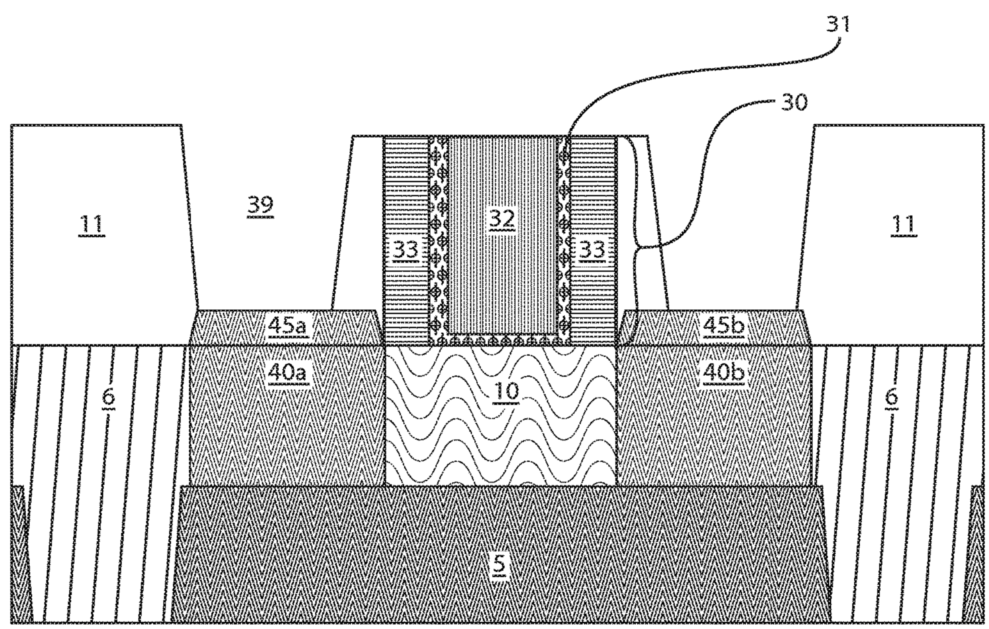
FIG. 6 is a side cross-sectional view of forming a dielectric layer over the structure depicted in FIG. 5, and forming a drain via opening through the dielectric layer to expose the drain region of the semiconductor device.

Some embodiments for a method for forming the electrical devices depicted in FIGS. 1-3 are now described with greater detail with reference to FIGS. 4-6. It is noted that although FIGS. 4-6 depict a semiconductor device 100 that is a FinFET, the methods depicted in FIGS. 4-6 are equally applicable to forming electrical devices including planar MOSFETs, as depicted in FIG. 2, and/or forming electrical devices including nanowires/nanosheets, as depicted in FIG. 3.

FIG. 4 depicts a semiconductor device 100 as an initial structure to forming the electrical device that includes the resistive random access memory cell 200 that is in direct contact with the drain region 40*a* of the semiconductor device 100, as depicted in FIG. 1. The semiconductor device 100 is a FinFET. The fin structures 10 may be formed using photolithography and etch processes. In one embodiment, the patterning process used to define each of the fin structures 55, 60 is a sidewall image transfer (SIT) process. The SIT process can include forming a mandrel material layer (not shown) on the material layer that provides the fin structures 10. The mandrel material layer can include any material (semiconductor, dielectric or conductive) that can be selectively removed from the structure during a subsequently performed etching process. In one embodiment, the mandrel material layer may be composed of amorphous silicon or polysilicon. The mandrel material layer can be formed by a deposition method, such as chemical vapor deposition or plasma enhanced chemical vapor deposition. Following deposition of the mandrel material layer, the mandrel material layer can be patterned by lithography and etching to form a plurality of mandrel structures on the topmost surface of the semiconductor containing material that provides the fin structures 10. In some embodiments, the SIT process may continue by forming a dielectric spacer on each sidewall of each mandrel structure. The dielectric spacer can be formed by deposition of a dielectric spacer material, and then etching the deposited dielectric spacer material. Since the dielectric spacers are used in the SIT process as an etch mask, the width of the each dielectric spacer determines the width of each fin structure 10. In some embodiments, after formation of the dielectric spacers, the SIT process continues by removing each mandrel structure. Following the mandrel structure removal, the SIT process continues by transferring the pattern provided by the dielectric spacers into the semiconductor material layer that provides the fin structures 10. The pattern transfer may be achieved by utilizing at least one etching process that can include dry etching, such as reactive ion etching (RIE), plasma etching, ion beam etching or laser ablation, chemical wet etch processes or a combination thereof. Following etching, i.e., pattern transfer, the SIT process may conclude with removing the dielectric spacers using an etch process or a planarization process. It is noted that the aforementioned spacer image transfer (SIT) process is only one method of forming the fin structures 10. In another embodiment, each of the fin structures 10 may be formed using a photoresist etch mask.

In the embodiments, in which the channel region is present in nanosheets/nanotubes, instead of forming a fin structure, a stacked structure of nanolayers of at least two different compositions is formed. Following formation of the stack, and after forming a supporting structure such as a spacer, one of the nanolayers is removed selectively to a remaining nanolayer. The remaining nanolayer is supported over a supporting substrate by the supporting structure, i.e., spacer. The remaining nanolayer provides the nanosheet or is further processed to provide a nanowire.

Following the formation of the fin structures 10 (or nanowires/nanosheets), the gate structures 30 are then formed. The gate structure 30 typically includes at least a gate dielectric 31 that is present on the channel region the fin structures 10, and a gate electrode 32 that is present on the gate dielectric 31. In the embodiments, in which the semiconductor device is a planar MOSFET, as depicted in FIG. 2, the gate structure 30 may be formed on a portion of the semiconductor substrate 5 that includes the channel region of the device. In the embodiments, in which the semiconductor device is a FinFET, the gate structure 41 that is formed is a gate all around gate structure.

In one embodiment, the at least one gate dielectric layer 31 includes, but is not limited to, an oxide, nitride, oxynitride and/or silicates including metal silicates, aluminates, titanates and nitrides. In one example, when the at least one gate dielectric layer 31 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer may vary, but typically, the at least one gate dielectric layer 31 has a thickness from 1 nm to 10 nm.

The conductive material of the gate electrode 32 may comprise polysilicon, SiGe, a silicide, a metal. Examples of metals that can be used as the gate electrode include, but are not limited to, Al, W, Cu, and Ti or other like conductive metals. The layer of conductive material for the gate electrode may be doped or undoped. If doped, an in-situ doping deposition process may be employed. Alternatively, a doped conductive material can be formed by deposition, ion implantation and annealing.

The gate structure 30 may be formed by using a deposition method, such as a chemical vapor deposition method and/or a physical vapor deposition (PVD), to deposit the material layers for the at least one gate dielectric layer and the at least one gate electrode followed by photolithography and etch processing. In some embodiments, a gate sidewall spacer 33 can be formed on the sidewall of the gate structure 30. In one embodiment, the gate sidewall spacer 33 may be formed by using a blanket layer deposition process, such as CVD, and an anisotropic etchback method.

In a following process step, the method continues with forming source regions 40*b* and drain regions 40*a* on the source and drain region portions of the fin structures 10 that are present on opposing sides of the fin structure's channel region. For the FinFET semiconductor devices, forming the source and drain regions includes forming the source and drain regions on portions of the fin structures 10, but in the embodiments in which the semiconductor device is a planar MOSFET, the source and drain regions may be formed in portions of the substrate 5 that are on opposing sides of the channel region of the substrate 5. For semiconductor devices having a channel region present within a nanowire, the source and drain regions are formed on source and drain region portions of the nanowire.

The conductivity type, i.e., whether n-type or p-type, of the source and drain regions 40*a*, 40*b* typically dictate the conductivity type of the semiconductor device, i.e., whether the semiconductor device is n-type or p-type. As used herein, "p-type" refers to the addition of impurities to an intrinsic semiconductor that creates deficiencies of valence electrons. For example, in a type IV semiconductor material, such as silicon (Si), germanium (Ge) or silicon germanium (SiGe), examples of p-type dopants, i.e., impurities, include but are not limited to: boron, aluminum, gallium and indium. As used herein, "n-type" refers to the addition of impurities that contributes free electrons to an intrinsic semiconductor. For example, in a type IV semiconductor, such as a silicon (Si), germanium (Ge), and silicon germanium (SiGe), examples of n-type dopants, i.e., impurities, include but are not limited to antimony, arsenic and phosphorous.

FIG. 5 depicts one embodiment of epitaxially forming a lower electrode on the drain region 40*a* of the semiconductor device. The lower electrode can also provide an epitaxial semiconductor portion of the semiconductor device. For example, for the FinFET devices, as depicted in FIG. 1 and FIG. 5, the lower electrode of the resistive random access memory (ReRAM) cell 200 is provided by an epitaxial semiconductor material 45*a* that provides a portion of the drain region 40*a* of the FinFET. For example, for the planar MOSFET devices, as depicted in FIG. 2, the lower electrode of the resistive random access memory (ReRAM) cell 200 is provided by an epitaxial semiconductor material 45*a* that provides a raised drain region portion of the drain region 40*a* of the FinFET. In the example that is depicted in FIG. 3, the lower electrode of the resistive random access memory (ReRAM) cell is provided by an epitaxial formed drain portion of the nanowire 11.

"Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The term "epitaxial semiconductor material" denotes a semiconductor material that has been formed using an epitaxial deposition or growth process.

It is noted that simultaneously with forming the epitaxial semiconductor material 45*a* that is formed on the drain region 40*a* of the device, a substantially identical epitaxial semiconductor material 45*b* is formed on the source region 40*b* of the device. The epitaxial semiconductor material 45*a* for the lower electrode of the resistive random access memory cell 200, as well as an epitaxial material portion 45*a*, 45*b* of the drain region 40*a* and source region 40*b* of the semiconductor device 100, may be a type IV s semiconductor, such as silicon (Si), silicon germanium (SiGe), germanium (Ge), silicon doped with carbon (Si:C), or the epitaxial semiconductor material 45*a* may be at type III-V compound semiconductor material, such as gallium arsenide (GaAs).

The epitaxial semiconductor material 45*b*, 45*a* may be doped to the conductivity type of the source and drain regions 40*b*, 40*a*. The dopant may be introduced to the epitaxial semiconductor material using in-situ doping. The term "in-situ" as used to describe the dopant that provides the conductivity type of the source and drain semiconductor material means that the dopant, e.g., p-type dopant, that dictates the conductivity type of the epitaxially formed in situ doped source and drain semiconductor material is introduced during the process step, e.g., epitaxial deposition, which forms the in situ doped source and drain semiconductor material. In some embodiments, the charge carrier type dopant in the epitaxial semiconductor material 45*a*, 45*b* is present in a concentration ranging from $1\times10^{20}$ dopants/$cm^3$ to $2\times10^{20}$ dopants/$cm^3$.

It is noted that in the above examples, a gate first process has been described for forming the gate structure 30, 41. The methods and structures of the present disclosure are not limited to only this process flow, as gate last processing is also suitable for use with the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

FIG. 6 depicts one embodiment of forming a first dielectric layer 11 over the structure depicted in FIG. 5, and forming a drain via opening 39 through the first dielectric layer 11 to expose the drain region 40*a* of the semiconductor device. More specifically, the drain via opening 39 exposes the portion of the doped epitaxial semiconductor material 45*a* that is present on the drain region 40*a* that provides the lower electrode for the resistive random access memory cell 200. The first dielectric layer 11 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H).

The via opening 39 to the drain region 40*a* may be formed using photolithography and etch processes. In some embodiments, simultaneously with forming the via opening 39 to the drain region 40*a*, a via opening may also be formed to the source region 40*b*. For example, a photoresist mask may be formed exposing the portion of the dielectric material layers in which the via opening is to be formed, wherein following formation of the photoresist mask, the via opening may be etched into the first dielectric layer 11 using an etch process, such as reactive ion etch (RIE).

Figure 7:
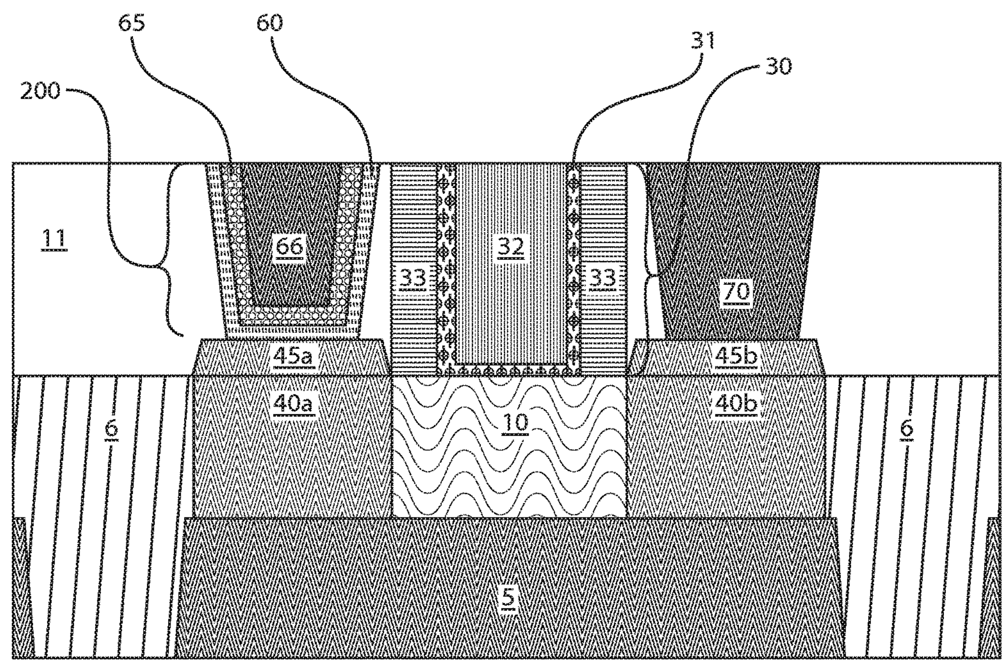
FIG. 7 is a side cross-sectional view depicting forming a resistive random access memory cell within the drain via opening, in accordance with one embodiment of the present disclosure.

FIG. 7 depicts forming a portion of the resistive random access memory cell 200 within the drain via opening 39. In some embodiments, prior to forming the portion of the resistive random access memory cell 200 that is present in the drain via opening 39, a block mask may be formed over the via opening to the source region 40*a* of the device.

The metal oxide layer 60 (also referred to as switching dielectric layer 60) for the resistive random access memory cell 200 is deposited within the drain via opening 39 using a conformal deposition process. In some embodiments, the metal oxide layer 60 is composed of a composition selected from the group consisting of hafnium oxide ($HfO_2$), tantalum oxide ($Ta_2O_5$), titanium oxide ($TiO_2$), tungsten oxide ($WO_3$), zirconium oxide ($ZrO_2$), aluminum oxide ($Al_2O_3$), strontium titanium oxide ($SrTiO_3$) and combinations thereof. The metal oxide layer 60 may have a thickness ranging from 1 nm to 15 nm. In one example, the metal oxide layer 60 may be composed of hafnium oxide ($HfO_2$), and may have a thickness ranging from 3 nm to 10 nm.

The metal oxide layer 60 is deposited into direct contact with the lower electrode that is provided by the doped epitaxial semiconductor material 45*a* of the drain region 40*a*. The metal oxide layer 15 can be formed using atomic layer deposition (ALD). Atomic Layer Deposition (ALD) is a thin film deposition method in which a film is grown on a substrate by exposing its surface to alternate gaseous species (typically referred to as precursors). In contrast to chemical vapor deposition, the precursors in ALD are never present simultaneously in the reactor, but instead are inserted as a series of sequential, non-overlapping pulses. In each pulse, the precursor molecules react with the surface in a self-limiting way, so that the reaction terminates once all the reactive sites on the surface are consumed. Consequently, the maximum amount of material deposited on the surface after a single exposure to all of the precursors (a.k.a. an ALD cycle) is determined by the nature of the precursor-surface interaction. By varying the number of ALD cycles, it is possible to grow materials uniformly and with high precision on arbitrarily complex and large substrates such as three-dimensional structures. For example, the metal oxide layer 60 can be deposited by atomic layer deposition of $HfO_2$ using subsequent pulsed of $HfCl_4$ and $H_2O$ precursors at temperatures above 200 C.

It is noted that atomic layer deposition (ALD), is only one example of a deposition process for forming the metal oxide layer 60 (also referred to as switching dielectric layer 60). In some other embodiments, the deposition process may be chemical vapor deposition, such as plasma enhanced chemical vapor deposition (PECVD).

In some embodiments, following the formation of the metal oxide layer 60, a conformal material layer for the upper electrode 65 may be deposited using atomic layer deposition (ALD). The material layer (or material layers) for the upper electrode 65 that can be formed using atomic layer deposition may be formed in direct contact with the metal oxide layer 60. For example, one or more material layers for the upper electrode 65 can be formed in direct contact with the metal oxide layer 60. In some embodiments, the upper electrode 65 can be composed of a metal containing composition selected from the group consisting of titanium nitride (TiN), tantalum nitride (TaN), (M)AlC, where M is a transition metal selected from the group consisting of Ti, Ta, and Nb, and combinations thereof. In some embodiments, the upper electrode 65 may have a thickness ranging from 1 nm to 70 nm.

It is noted that atomic layer deposition (ALD), is only one example of a deposition process for forming the metal oxide layer 60 (also referred to as switching dielectric layer 60). In some other embodiments, the deposition process may be chemical vapor deposition, such as plasma enhanced chemical vapor deposition (PECVD).

The upper electrode 65 can be composed of a single metal composition and can be composed of a single atomic layer deposition (ALD) formed layer. In other embodiments, the upper electrode 65 is composed of a material stack including a titanium (Ti) rich titanium nitride (TiN) layer, and a titanium aluminum carbon containing, e.g., (Ti)AlC, containing stack. In one example, the upper electrode 65 is composed of a titanium nitride (TiN) first layer having a thickness ranging from 0.3 nm to 3 nm that is in direct contact with the metal oxide layer 60; a titanium aluminum carbon (TiAlC) layer having a thickness ranging from 1 nm to 5 nm that is in direct contact with the titanium nitride (TiN) first layer; and a titanium nitride (TiN) second layer having a thickness ranging from 10 nm to 50 nm that is in direct contact with the titanium aluminum carbon (TiAlC) layer. In some embodiments, the material layer (or layers) for the upper electrode 65 may be conformally deposited blanket layers that can be formed by atomic layer deposition (ALD). The upper electrode 65 can have a U-shaped geometry.

It is noted that atomic layer deposition (ALD), is only one example of a deposition process for forming the upper electrode 65. In some other embodiments, the deposition process may be chemical vapor deposition, such as plasma enhanced chemical vapor deposition (PECVD).

In some embodiments, following the formation of the material layer for the upper electrode 65, a remainder of the via opening not occupied by the upper electrode 65, and the metal oxide layer 65 is filled with a metal fill 66. In some embodiments, a diffusion barrier may be deposited prior to forming the metal fill. The diffusion barrier may be a conformally deposited layer composed of tantalum nitride (TaN). The tantalum nitride (TaN) layer may be formed by atomic layer deposition and/or chemical vapor deposition. The metal fill 66 may be deposited atop the diffusion barrier (when present), or the metal fill 66 may be deposited directly on the upper electrode 65.

In some embodiments, the hard mask may be removed from the source via opening. The metal fill 66 may then be simultaneously formed in both the via opening to the drain region 40*a* and the via opening to the source region 40*b*.

In some examples, the metal fill 66 may be composed of tungsten (W), aluminum (Al), copper (Cu), cobalt (Co), titanium nitride (TiN) or combinations thereof. The metal fill 66 may be deposited using physical vapor deposition (PVD), e.g., sputtering; plating, e.g., electroplating and/or electroless plating; chemical vapor deposition, atomic layer deposition (ALD); or a combination thereof. In some embodiments, the metal fill 66 fills an entirety of the remaining space of the via opening 39 to the drain region 40*a*. The metal fill also fills the via opening to the source region 40*b*. The metal fill that is deposited in the via opening provides a source contact 70.

In some embodiments, following formation of the metal fill 66, and the source contact 70, the structure may be planarized to remove the portions of the metal fill 66 and the metal oxide layer 60 and the upper electrode 65 that extend outside the via opening 39. The planarization process may include chemical mechanical planarization, a reactive ion etching process (RIE), or a combination thereof.

Referring to FIG. 1, in a following process sequence the second dielectric layer 12 and the third dielectric layer 13 may be deposited. The second dielectric layer 12 and the third dielectric layer 13 are similar to the first dielectric layer 11. Therefore, the description of the first dielectric layer 11 is suitable for describing at least one embodiment of the composition for the second dielectric layer 12 and the third dielectric layer 13. The source line 71, the bit line 75 and the word line 85 may each be formed in at least one of the aforementioned dielectric layer using photolithography, etch and deposition processes.

Figure 8:
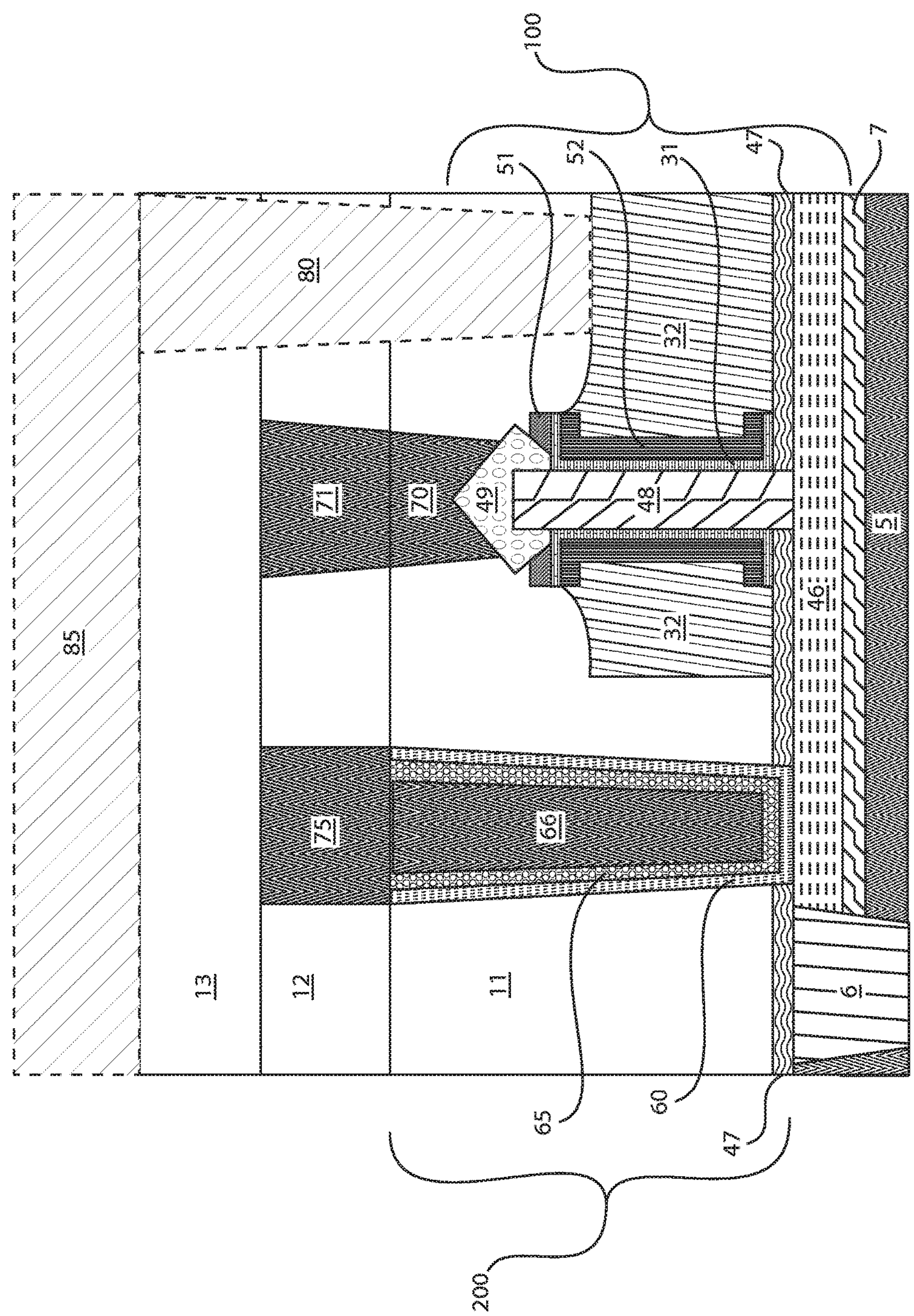
FIG. 8 is a side cross-sectional view of a vertical field effect transistor (VFET) having a vertical oriented channel region and a resistive random access memory cell that is integrated with the VFET by direct contact to the VFETs drain region, in accordance with one embodiment of the present disclosure.

FIG. 8 depicts one embodiment of a vertical field effect transistor (VFET) 100 having a vertically oriented channel region 48 and a resistive random access memory cell 200 that is in integrated with the VFET by direct contact to the VFETs drain region 46. In some embodiments, the electrical device includes a semiconductor device 100 including a source region 49 and a drain region 46 on opposing sides of a vertically orientated channel region 48 of a semiconductor material; and a resistive random access memory (ReRAM) cell 200 positioned within a via contact to the drain region 46. A "vertical" semiconductor device has the drain, channel, and source device components arranged perpendicular to the plane of the substrate surface, which is referred to as a vertical stack. The resistive random access memory cell 200 may include a bottom electrode 46 provide by doped epitaxial semiconductor material that provides the drain region of the vertical semiconductor device, a switching layer 60 comprised of a metal oxide present on the bottom electrode 46, and a top electrode 65 of a metal nitride that is present atop the switching layer 60 of the metal oxide.

The drain region 46 of the vertical transistor is provided by an epitaxial semiconductor material layer that is doped with an n-type or p-type dopant that is present atop a counter doped layer 7, in which the counter doped layer 7 separates the drain region 46 from the supporting substrate 5. The counter doped region 7 has a conductivity type, e.g., n-type or p-type conductivity, that is opposite the conductivity type of the doped epitaxial semiconductor material layer that provides the drain region 46 of the VFET. For example, when the counter doped layer 7 has an n-type conductivity, the drain region 46 has a p-type conductivity. In another example, when the counter doped layer 7 has a p-type conductivity, the drain region has an n-type conductivity. It is noted that the counter doped layer 7 can be an epitaxial semiconductor material that is formed atop the supporting substrate 5, and the epitaxial semiconductor material layer that provides the drain region 46 is epitaxially formed on the counter doped layer 7. The n-type or p-type dopant that is present in the epitaxial semiconductor material layer that provides the drain region 46 can be present in a concentration ranging from $1\times10^{20}$ dopants/$cm^3$ to $2\times10^{20}$ dopants/$cm^3$.

Still referring to FIG. 8, the vertically orientated channel 48 has a first end that is in direct contact with the drain region 46. A gate structure is present on the vertically orientated channel 48. The gate structure includes a gate dielectric layer 31 present directly on the vertically orientated channel 48, and a gate conductor 32 present on the gate dielectric layer 31. In some embodiments, an n-type or p-type work function adjustment layer is present between the gate dielectric layer 31 and the gate conductor 32. In some embodiments, a work function adjusting layer 52 may be present between the gate dielectric layer 31 and the gate conductor 32. The gate structure may be separated from the drain region 46 of the VFET by a first dielectric spacer 47.

A source region 49 is present on an opposing end of the vertically orientated channel region 48 that is opposite the end of the vertically orientated channel region 48 that is in direct contact with the drain region 46 that is provided by the doped epitaxial semiconductor material layer present atop the counter doped layer 7. The source region 49 may be composed of an epitaxially formed semiconductor material that is in situ doped, and has a diamond like geometry, as depicted in FIG. 8. A portion of the source region 49 may be separated from the gate structure by a second spacer 51.

The counter doped layer 7, the doped epitaxial semiconductor layer that provides the drain region 46 of the VFET, the vertically orientated channel region 48 and the source region 49 may each be composed of a semiconductor material, such as a type IV semiconductor, e.g., silicon, and/or a type III-V semiconductor, e.g., gallium arsenide (GaAs). The source region 49 and the drain region 46 may each be doped to an n-type or p-type conductivity.

The VFET is encapsulated in a first dielectric layer 11. The first dielectric layer 11 depicted in FIG. 8 is similar to the first dielectric layer 11 that is described above with reference to FIG. 1. A drain via opening 39 is present extending through the first dielectric layer 11 to the doped epitaxial semiconductor layer that provides the drain region 46 of the VFET. The portion of the doped epitaxial semiconductor layer that provides the drain region 46 of the VFET that is exposed at the base of the drain via opening 39 provides the lower electrode of the resistive random access memory (ReRAM) device 200. The switching dielectric layer 60 may be a metal oxide layer that is a conformal layer present on the sidewalls of the drain via opening 30 and the lower electrode at the base of the drain via opening 39. The switching dielectric layer 60 that is depicted in FIG. 8 is similar to the switching dielectric layer 60 that is depicted in FIG. 1. Therefore, further details for the switching dielectric layer 60 that is depicted in FIG. 8 can be found in the description of this structure in FIG. 1. Still referring to FIG. 8, and upper electrode 65 is present atop the switching dielectric layer 60. The upper electrode 65 may be a metal nitride, or a multilayered structure including metal nitride layers and aluminum containing layers. The upper electrode 65 may be a conformal layer. The upper electrode layer 65 that is depicted in FIG. 8 is similar to the upper electrode layer 65 that is depicted in FIG. 1. Therefore, further details for the upper electrode layer 65 that is depicted in FIG. 8 can be found in the description of this structure in FIG. 1.

The remainder of the structures having reference numbers in FIG. 8 are similar to the structures having the same reference numbers in FIG. 1. Therefore, the description of the structures having reference numbers in FIG. 1 are suitable for describing the structures having the same reference numbers in FIG. 8. For example, a metal fill 66 may be present atop the upper electrode layer 65 filling the drain via opening. The composition of the metal fill 66 may be the same as the composition of the metal fill 70 that is present in the contact via to the source region 40*b*, which may be referred to as a source contact 70. The structure depicted in FIG. 8 may also include a bit line 75 that is in direct contact with the resistive random access memory cell 200, and a source line 71 that is in electrical communication with the source contact 70. A word line 85 is present in electrical communication with the gate contact 80.

Some embodiments of a method for forming the structure depicted in FIG. 8, are now described with reference to FIGS. 9 and 10.

Figure 9:
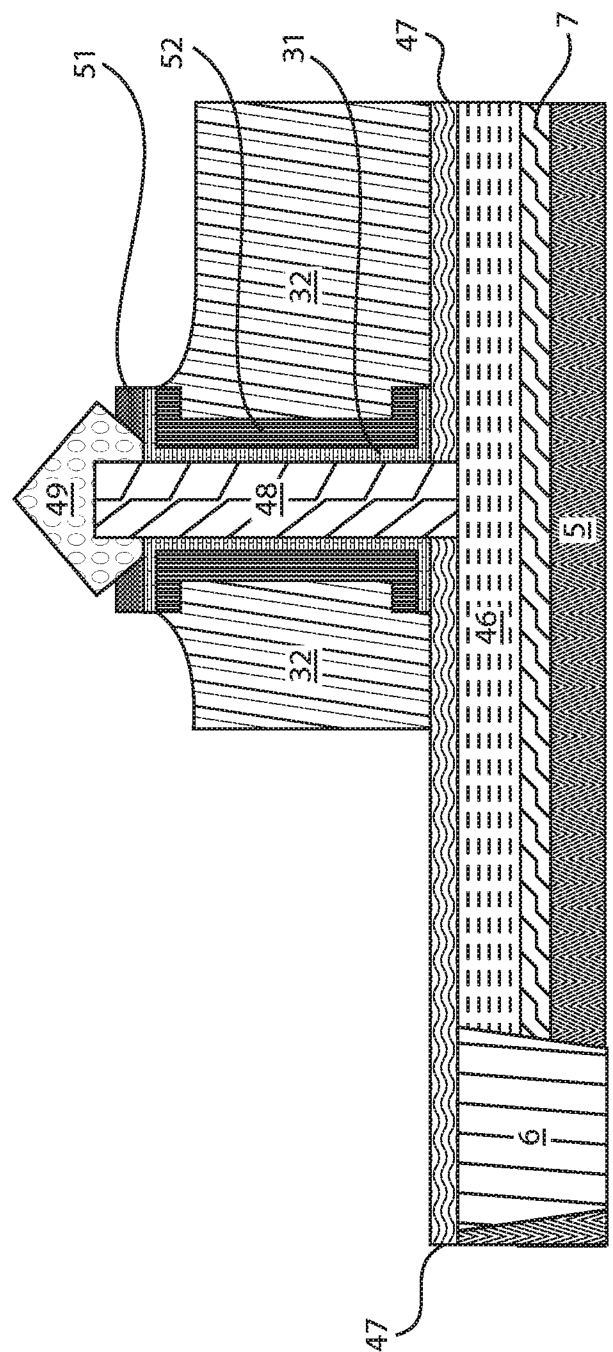
FIG. 9 is a side cross-sectional view of a vertical field effect transistor (VFET) as an initial structure in a method for forming the VFET in combination with a resistive random access memory cell, as depicted in FIG. 8.

FIG. 9 depicts one embodiment of a vertical field effect transistor (VFET) as an initial structure in a method for forming the VFET in combination with a resistive random access memory cell 200. An initial structure for forming the VFET may include a counter-doped layer 7 that is formed over a supporting substrate 5, and a doped epitaxial semiconductor layer for the drain region 46 of the device may be present atop the supporting substrate 5. The doped epitaxial semiconductor layer for the drain region 46 of the device is similar to the doped epitaxial semiconductor material 45*a* of the semiconductor devices described above with reference to FIGS. 1 and 5. Therefore, the above description for the epitaxial deposition and in situ doping method for forming the doped epitaxial semiconductor material 40*a* that is depicted in FIGS. 1 and 5 is suitable for describing the composition, dopant concentration and method of forming the doped epitaxial semiconductor layer for the drain region 46.

A gate material stack may then be formed including a bottom spacer layer 47, a first gate structure layer (sacrificial gate structure layer), and a top spacer layer 51. Each of these material layers maybe deposited using a method, such as chemical vapor deposition (CVD), e.g., plasma enhanced chemical vapor deposition (PECVD). The bottom spacer layer 47 may be composed of a dielectric, such as silicon nitride; the gate structure layer may be a sacrificial material layer, such as polysilicon, and the top spacer layer may be composed of a dielectric, such as silicon nitride.

An upper dielectric layer may be present on the top spacer layer 51. The upper dielectric layer has a thickness that is selected to correspond to the portion of the subsequently epitaxially semiconductor material (having the geometry of a fin structure) that will extend beyond the channel region of the vertically oriented channel region 48 into the source region portion of the device.

In a following process sequence, the vertically orientated channel 48 is formed. The vertically orientated channel region 48 is formed by patterning the gate material stack (including the upper dielectric layer) to form a channel via opening extending to the doped epitaxial semiconductor layer for the drain region 46. Forming the channel via opening includes forming an etch mask atop the gate material stack, i.e., on the upper dielectric layer that is overlying the gate material stack. The etch mask may be formed using a deposition process to deposit a photoresist layer, a photolithography step to pattern the photoresist mask, and a chemical development step to develop the pattern into the etch mask, in which the opening provided by the etch mask corresponds to the channel via opening. Using the etch mask, etching can include a dry etching process such as, for example, reactive ion etching, plasma etching, ion etching or laser ablation, to etch through the top spacer layer 51, the sacrificial gate structure layer and the bottom spacer layer 47.

Following formation of the channel via opening that exposes a portion of the doped epitaxial semiconductor layer that provides the drain region 46, a thin oxide is formed on the sidewalls provided by the sacrificial gate layer in the channel via opening. The thin oxide may be formed by subjecting the sidewalls to oxygen containing atmosphere, in which the temperature of the thin oxide forming process may be greater than room temperature, e.g., 20° C. to 25° C.

The epitaxial semiconductor material (having the vertical fin type geometry) that provides the vertically orientated channel region 48 is then epitaxially formed filling the channel via opening. It is noted that a portion of the epitaxial semiconductor material grows to a height greater than the upper surface of the top spacer layer 51. The epitaxial semiconductor material that provides the vertically orientated channel region 48 can employ the exposed upper surface of the doped epitaxial semiconductor material that provides the drain region 46 that is present at the base of the channel via opening as the seed layer for the start of epitaxial growth.

Following formation of the vertically oriented channel region 48, a dielectric cap, e.g., silicon nitride cap, may be formed on the upper most surface of the epitaxially semiconductor material that provides the vertically orientated channel 48. This can be achieved by recessing the vertically oriented channel region 48 relative to the upper surface of the upper dielectric layer followed by filling the recess within a dielectric material for the dielectric cap. Thereafter, the upper dielectric layer may be removed selectively to the upper spacer layer. Removing the upper dielectric layer exposes the portion of the epitaxial semiconductor material that provides the source region end of the vertically orientated channel region 48.

Dielectric spacers, e.g., silicon nitride spacers, are then formed on the portion of the source region end of the vertically orientated channel region that extends above the upper spacer layer, and extends into contact with the dielectric cap. The dielectric spacers and the dielectric cap protect the source portion of the epitaxially semiconductor material that provides the vertically orientated channel during a process sequence in which the replacement gate is substituted with a functional gate structure. The functional gate structure functions to switch the VFET between on and off states. The functional gate structure may include the gate dielectric 31, an optional work function adjustment layer 52, and a gate conductor 32.

The sacrificial gate layer is completely removed to expose side surfaces of the thin oxide layers that were previously formed on the vertically orientated channel region 48. If the sacrificial gate layer is made of amorphous silicon, then, e.g., tetramethylammonium hydroxide (TMAH), can be used for such selective removal. In a following process step, the thin oxide layers are completely removed and the gate dielectric 31 is deposited on the vertically orientated channel region using a deposition process, such as atomic layer deposition. The composition of the gate dielectric 31 has been described above with reference to FIG. 8. In a following process sequence, the work function adjusting layer 52 and the gate conductor 32 may be deposited providing the material layers for the functional gate structure. The work function adjusting layer 52 may be a p-type or n-type work function metal layer. As used herein, a "p-type work function metal layer" is a metal layer that effectuates a p-type threshold voltage shift. In one embodiment, the p-type work function metal layer may be composed of titanium and their nitrided/carbide. An "n-type work function metal layer" is a metal layer that effectuates an n-type threshold voltage shift. In some embodiments, the n-type work function metal layer is composed of at least one of TiAl, TiAlC, TaN, TiN, HfN, HfSi, or combinations thereof. Exemplary gate conductor 32 materials include, but are not limited to, TaN, TiN, W, Co, Al, Cu and any alloy thereof. The material layers for the work function adjusting layer 52 and the gate conductor 32 may be deposited by plating, physical vapor deposition, chemical vapor deposition, atomic layer deposition or a combination thereof.

The material layers for the functional gate structure may then be patterned and etched to provide the geometry for the functional gate structure that is depicted in FIG. 9. During the process sequence for patterning the function gate structure, the dielectric spacers and the dielectric cap are removed to expose the source portion of the epitaxial semiconductor material that provides the vertically orientated channel region 48. The epitaxial semiconductor material for the source region 49 may then be formed using an epitaxial deposition process and in situ doping.

Figure 10:
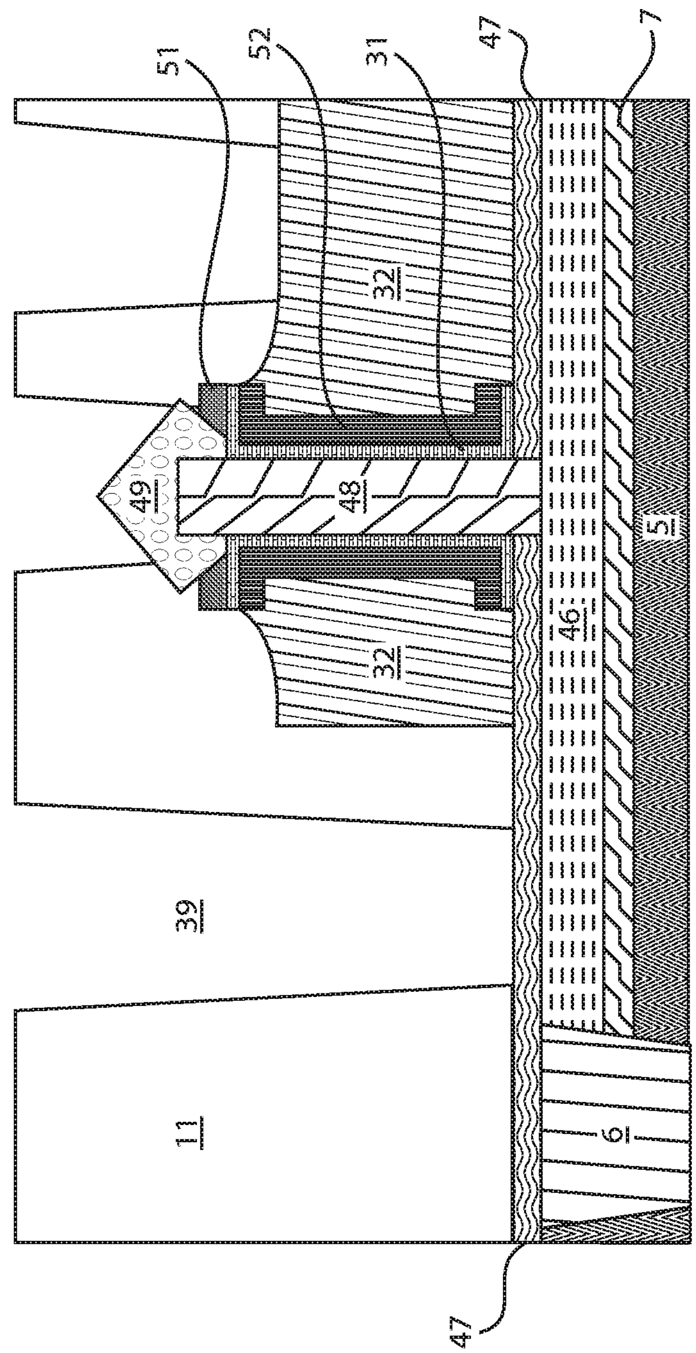
FIG. 10 is a side cross-sectional view of forming a dielectric layer over the structure depicted in FIG. 9, and forming a drain via opening through the dielectric layer to expose the drain region of the semiconductor device.

FIG. 10 depicts one embodiment of forming a dielectric layer 11 over the structure depicted in FIG. 9, and forming a drain via opening 39 through the dielectric layer 11 to expose the drain region 46 of the VFET semiconductor device. In some embodiments, the drain via opening 39 is formed through the bottom dielectric spacer 47. The dielectric layer 11 that is depicted in FIG. 10 is similar to the dielectric layer 11 that is depicted in FIG. 6. Therefore, the description of the first dielectric layer 11 depicted in FIG. 6, is suitable for describing at least one embodiment of the composition for the dielectric layer 11 that is depicted in FIG. 10. Further, the method of forming the drain via opening 39 has also been described above with reference to FIG. 6. During the process sequence for forming the drain via opening, a source via opening may also be formed.

Referring to FIG. 8, the metal oxide layer 60, the upper electrode 65, and the metal fill 66 for the resistive random access memory cell 200 may then be formed in the drain via opening 39. The method of forming the metal oxide layer 60, the upper electrode 65, and the metal fill 66 have been described above with reference to FIG. 1. Therefore, the method of forming, as well as the compositions, for the metal oxide layer 60, the upper electrode 65, and the metal fill 66 that have been described in FIG. 1 are suitable for describing these structures having the same reference numbers in FIG. 8. For example, in some embodiments, during forming the metal fill 66, the source contact 70 may be simultaneously formed having the same composition as the metal fill 66.

Referring to FIG. 8, in a following process sequence, a second dielectric layer 12 and the third dielectric layer 13 may be deposited. The second dielectric layer 12 and the third dielectric layer 13 are similar to the first dielectric layer 11. Therefore, the description of the first dielectric layer 11 is suitable for describing at least one embodiment of the composition for the second dielectric layer 12 and the third dielectric layer 13. The source line 71, the bit line 75 and the word line 85 may each be formed in at least one of the aforementioned dielectric layer using photolithography, etch and deposition processes.

It is noted that isolation regions 6 may be employed to electrically isolate the semiconductor devices from other electrical devices on the same substrate.

Having described preferred embodiments of an apparatus and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. An electrical device comprising:

a semiconductor device including a source region and a drain region on opposing sides of a channel region of a semiconductor material; and a resistive random access memory cell positioned within a via contact to the drain region of the planar orientated semiconductor device, wherein the resistive random access memory cell includes a bottom electrode provided by doped epitaxial semiconductor material that is in direct contact with the drain region of the semiconductor device and a switching layer comprised of a metal oxide that is present in direct contact with the bottom electrode.

2. The electrical device of claim 1, wherein the channel region is present in a fin structure that is horizontally orientated.

3. The electrical device of claim 2, wherein the planar orientated semiconductor device further comprises a gate structure including a gate dielectric that is present on the channel region of the fin structure, and a gate conductor on the gate dielectric.

4. The electrical device of claim 1, wherein the channel region present in an upper surface of a semiconductor material of a substrate.

5. The electrical device of claim 1, wherein the channel region is present in a suspended channel, and a gate all around (GAA) structure is present around the suspended channel.

6. The electrical device of claim 1, further comprising a top electrode of a metal nitride that is present atop the switching layer of the metal oxide.

7. The electrical device of claim 6, wherein at least one of the switching layer and the top electrode having a conformal thickness ranging from 1 nm to 15 nm.

8. An electrical device comprising:

a semiconductor device including a source region and a drain region on opposing sides of a vertically orientated channel region of a semiconductor material; and a resistive random access memory device positioned within a via contact to the drain region, wherein the resistive random access memory cell includes a bottom electrode provided by doped epitaxial semiconductor material that is in direct contact with the drain region of the semiconductor device and a switching layer comprised of a metal oxide that is present in direct contact with the bottom electrode.

9. The electrical device of claim 8 further comprising a top electrode of a metal nitride that is present atop the switching layer of the metal oxide.

10. The electrical device of claim 9, wherein at least one of the switching layer and the top electrode having a conformal thickness ranging from 1 nm to 15 nm.

11. A method is provided for forming an electrical device comprising:

forming a semiconductor device including a source region and a drain region on opposing sides of a channel region;

forming a dielectric layer over the semiconductor device;

forming a drain via opening may be formed through the dielectric layer to expose an upper surface of the drain region of the semiconductor device; and forming at least a portion of a resistive random access memory cell in the drain via opening in direct contact with the drain region of the semiconductor device, wherein the resistive random access memory cell includes a bottom electrode provided by doped epitaxial semiconductor material that is in direct contact with the drain region of the semiconductor device and a switching layer comprised of a metal oxide that is present in direct contact with the bottom electrode.

12. The method of claim 11, wherein the semiconductor device is a vertically orientated field effect transistor having a vertically orientated channel region.

13. The method of claim 11, wherein the semiconductor device is a fin type field effect transistor having a horizontally orientated channel region.

14. The method of claim 11, wherein the semiconductor device is a metal oxide semiconductor field effect transistor having a channel region horizontally orientated in an upper surface of a semiconductor material of a substrate.

15. The method of claim 11, further comprising forming a bottom electrode of doped semiconductor material epitaxial grown on a surface of the drain region of the semiconductor device prior to depositing the dielectric material.

16. The method of claim 15, wherein said forming the portion of the resistive random access memory cell in the drain via opening comprises:

forming a metal oxide layer in direct contact with the bottom electrode, wherein the metal oxide layer is formed using a conformal deposition process directly on the bottom electrode at a base of the drain via opening and on sidewalls of the dielectric layer in the drain via opening; and forming an upper electrode with a conformal deposition process in direct contact with the metal oxide layer.

17. The method of claim 16, wherein the metal oxide layer is composed of a composition selected from the group consisting of hafnium oxide (HfO2), tantalum oxide ($Ta_2O_5$), titanium oxide ($TiO_2$), tungsten oxide ($WO_3$), zirconium oxide ($ZrO_2$), aluminum oxide ($Al_2O_3$), strontium titanium oxide ($SrTiO_3$) and combinations thereof.

18. The method of claim 17, wherein the upper electrode is a metal nitride selected from the group consisting of titanium nitride, tantalum nitride, tungsten nitride and combinations thereof.

19. The method of claim 17, wherein the upper electrode is a multi-layered structure comprising a first titanium nitride layer, an aluminum containing layer on the first titanium nitride layer, and a second titanium nitride layer on the aluminum containing layer.

20. The method of claim 19, wherein a metal fill is present atop the upper electrode that is filling the drain via opening.

* * * * *